United States Patent [19]

Culp et al.

[11] Patent Number: 4,490,217
[45] Date of Patent: Dec. 25, 1984

[54] METHOD OF MAKING A STENCIL PLATE

[75] Inventors: Charles R. Culp, Lancaster; Stephen G. Mearig, Mountville, both of Pa.

[73] Assignee: Armstrong World Industries, Inc., Lancaster, Pa.

[21] Appl. No.: 583,197

[22] Filed: Feb. 24, 1984

[51] Int. Cl.³ .............................................. C25D 1/08
[52] U.S. Cl. ..................................................... 204/11
[58] Field of Search ......................................... 204/11

[56] References Cited

U.S. PATENT DOCUMENTS

| | | | |
|---|---|---|---|
| 3,192,136 | 6/1965 | Reid | 204/11 |
| 3,402,110 | 9/1968 | Scherrer | 204/11 |
| 3,586,609 | 6/1971 | Jansen | 204/11 |
| 3,836,367 | 9/1974 | Klemm | 204/11 |
| 4,080,267 | 3/1978 | Castellani | 204/11 |

Primary Examiner—Thomas Tufariello

[57] ABSTRACT

A stencil plate is made by an electroplating process rather than a steel fabricating process. A resist material and a film were placed upon a matrix and by using conventional photoresist operations, a resist coating is formed on the matrix in the shape of the apertures to be formed in the stencil plate. Metal is electroplated on the upper surface of the matrix and around the shaped resist material forming a stencil plate.

Subsequently, another resist coating may be placed over the first plated material and openings are formed in the second resist material. Upon a subsequent plating operation, these openings are filled with a plating material and this provides a color dams structure around the openings in the originally formed stencil plate.

2 Claims, 7 Drawing Figures

METHOD OF MAKING A STENCIL PLATE

BACKGROUND OF THE INVENTION

1. Field of the Invention

The invention is directed to a method of making a stencil plate and, more particularly, to the forming of a stencil plate by an electroplating operation.

2. Description of the Prior Art

U.S. Pat. No. 3,192,136 discloses the basic steps of depositing a photoresist image onto a substrate, developing the photoresist image in a desired pattern, washing away the non-exposed photoresist material, electrodepositing a metal around the formed resist layer and then removing the remaining resist material. There is provided a second photoresist layer and this is developed into a pattern. The undeveloped photoresist is removed and again there is a metal layer formed to fill in the areas with the undeveloped photoresist removed. Therefore, the patent provides the showing of a dual photoresist electroplating method to result in a mask having apertures therein.

U.S. Pat. No. 4,080,267 discloses a method for forming thick self-supporting masks wherein thickness is achieved by multiple steps of coating a base with resist, exposing the resist, developing an image and then plating.

U.S. Pat. No. 3,586,609 discloses the basic concept of forming a metal stencil using both electrodeposition and photoresist methods. The patent would appear to teach formation of a pattern of electrically insulating spots on a cylinder of electrically conductive material.

U.S. Pat. No. 3,836,367 is directed to a stencil formation device which discloses a method for the photomechanical composition of designs on stencils.

U.S. Pat. Nos. 3,372,639; 3,610,143; 4,033,831; 4,039,397 and 4,211,618 are other patents which show various photoresist and electrodeposition formation of screens, masks, printing plates or similar elements.

SUMMARY OF THE INVENTION

There is disclosed a method of forming a flat stencil plate. The first step involves the placing of a first photoresist coating on the surface of the matrix. A film artwork is placed over the surface of the resist coating and the film is exposed to sensitize the resist coating in selected regions beneath the film artwork. The exposed resist coating is developed and this produces a pattern of resist material with large open areas of no resist material on the matrix and small islands of resist material on the matrix. The surface of the matrix is then plated to deposit a material in the large open areas and around the resist material. This then forms a plate structure with apertures therein, and this deposit of material is removed from the matrix to form the stencil plate.

It is possible that some islands of resist material have open areas in the center thereof and channel means in the resist connect these open areas in the center of the island with the large open areas in the matrix. When the plating operation is carried out, there will be the deposition of plating material in the open areas in the center of the resist islands and also the deposition of plating material in the channels connecting the two open areas.

It is possible to place a second resist coating on the surface of the first deposit material to form a flat surface coating which would then be covered by a film artwork and exposed to sensitize the second resist coating in selected regions beneath the film artwork. The developing of the exposed resist will provide a pattern of resist material which is basically a plurality of channel structures which will be located adjacent the apertures formed in the first plated surface. A second plating material is deposited in the open channel areas of the second layer of resist material, and this results in the formation of walls of deposited material around the outside perimeter of the apertures of the first layer of deposited material. The resist material and matrix are removed from the two layers of deposited material, and this provides a conventional stencil plate.

DESCRIPTION OF THE PREFERRED EMBODIMENT

Figure 1:
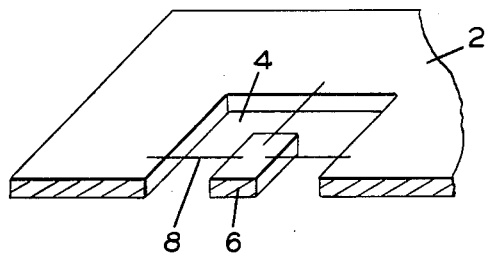
FIG. 1 is a perspective view in cross section of a conventional stencil plate fabricated by mechanical fabrication.

Herein is disclosed a method for forming a flat stencil plate. FIG. 1 shows a stencil plate which is formed by conventional techniques using steel fabrication techniques. A metal plate 2 has cut therein apertures 4. Sometimes it is necessary that elements 6 be placed within the mid-region of the apertures 4. When elements 6 are put into place, they must be supported relative to plate 2 by the use of wires 2 which will be brazed to both elements 4 and 6. In use, the stencil plate is such that the apertured areas of the plate function as passage ways through which material may be passed to be placed down in a stencil pattern.

Figure 2:
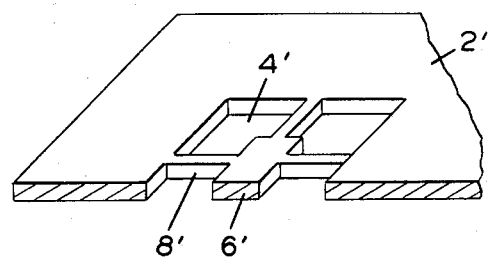
FIG. 2 is a perspective view in cross section of a stencil plate formed by the invention herein.

FIG. 2 is the showing of a stencil plate formed by the invention herein. Element 2' is a basic plate structure which is formed by the electro-depositing of metal. Metal is deposited in such a manner that openings 4' are formed. At the same time that element 2' is formed, element 6' would also be formed in the region of the apertures. Element 6' is supported relative to element 2' by channels 8' of deposited metal which function the same as the support wires 8 of FIG. 1 to hold element 6' relative to element 2'.

Figure 3:
FIG. 3 is a cross-sectional view of the forming of the resist pattern on the matrix.

FIG. 3 shows the beginning of the method of forming a flat stencil plate by the invention herein. A first resist coating 12 is placed on the surface of the matrix. The matrix is basically a plate of copper, aluminum or stainless steel which is used as the base upon which to deposit material by an electro-depositing operation. The matrix is a conductive material. The photoresist material can be a conventional material such as the Shipley Co. photoresist AZ119 which is a positive resist and it is deposited to a thickness of about 1-2 mils on the surface of the matrix 10. A film 14 is placed over the resist coating 12. The film has an artwork pattern similar to that that one desires to form in the resist. The pattern in the film will be similar to the aperture shape and the aperture arrangements that are desired in the finished stencil plate. The next step is the exposing of the film artwork and resist to sensitized resist coating in selected regions beneath the film artwork followed by the developing of the exposed resist coating to provide the desired pattern of resist material on the matrix. Subsequent layers of resist may be placed in register to the first resist layer to get a desired thicker resist layer prior to plating.

Figure 4:
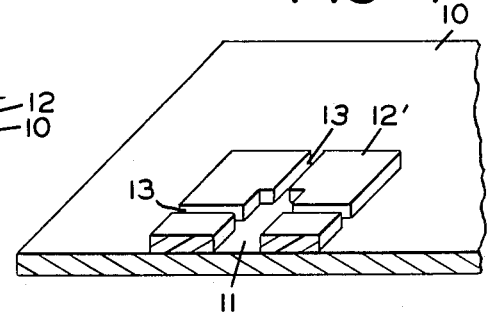
FIG. 4 is a perspective view in cross section of the resist pattern on the matrix prior to the plating.

FIG. 4 is a showing of the pattern of resist material which is on the matrix. The matrix is element 10 and the pattern of resist material is element 12'. The film is exposed in the conventional manner using UV light collimated to give parallel rays of light. The exposure is carried out from 6-12 minutes per resist layer, depending upon the specific resist material being utilized. The resist material is then developed and the matrix surface is washed, resulting in the formation on the surface of the matrix of a deposition of hardened resist material in a pattern, the pattern being determined by the image on the film work, and that pattern is shown in FIG. 4.

Figure 5:
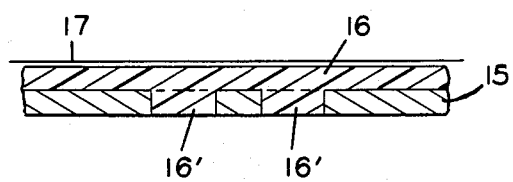
FIG. 5 is a cross-sectional view of the first deposited material covered with a second resist coating.

The conductive matrix with the resist 12' is then placed in a conventional plating tank to electrodeposit metal, preferably nickel on the surface of the matrix 10. About 10-40 mils of metal are deposited on the surface of the matrix in a conventional manner. The material deposited is shown as element 15 of FIG. 5 and, for convenience, the matrix 10 is not shown below element 15. It will be seen that element 15 is provided with a plurality of apertures which result from the presence of the resist material. In FIG. 5, the apertures 14 are shown filled with resist material which will be part of a subsequent plating operation.

It is possible that a finished stencil plate could be formed with simply the above-described method.

It should be noted that the pattern of resist material 12' could appear as a solid block of resist material which would be used simply to form an aperture in the plated material forming the stencil plate. However, it is sometimes convenient to have elements 6' supported within the middle of an opening so that rather than forming a solid block of stencil material, one could form a block of stencil material with an open area in the center into which another stencil material of a different color could be deposited. In order to form the element 6' and its supporting structure 8' in an aperture, it is necessary, as shown in FIG. 4, to provide the block of resist material 12' with an opening 11 and channels 13 which, in effect, connect the opening 11 with the larger open areas which surround the block of resist material 12'. It is the resist pattern of FIG. 4 which forms the structure of FIG. 2. Normally, the channels 13 are of a width of 0.025-0.040 inches and do not result in forming an image in the deposited stencil material.

Once the plating operation is carried out on the matrix 10 in resist material 12' of FIG. 4, the resist material and matrix can be removed from the deposited material to form the stencil plate.

Figure 6:
FIG. 6 is a showing of the pattern of the second resist coating.

A subsequent plating operation may be carried out. Now, a second resist coating 16 is placed over top of the electro-deposited material which formed the stencil plate in FIG. 2. The resist coating will not only cover the top of the stencil plate, but will also fill in the apertures 14 within the stencil plate. Another film work 17 is placed over the resist material and by the above-described exposing and developing technique, element 16 is now provided with a pattern as shown in FIG. 6.

Figure 7:
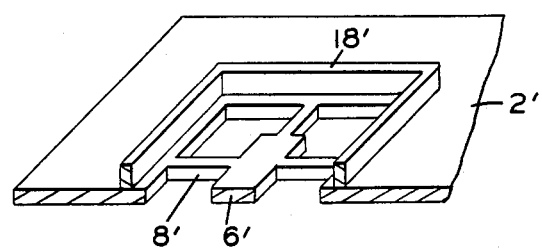
FIG. 7 is a perspective view in cross section of a finished stencil plate formed by the invention herein with color dams.

The resist material is basically covering the bulk of the plate 15 and formed therein is a plurality of channels 18. A subsequent conventional plating operation will fill the channels 18 and upon the subsequent removal of the resist material from the apertures 14 and from the top of the stencil plate 15, there will be shown the structure of FIG. 7. In FIG. 7, there is shown the electro-deposited metal plate 2' which has the elements 6' supported by channels 8' in the apertures. Around the outside of the apertures on one side of the plate 2', there is deposited a wall structure 18' which forms the color dams for the stencil plate.

In operation, the plate is turned over or rotated 180 degrees so that the color dams are in position adjacent the surface to receive the stencil material. The stencil material passes down through the apertures in the pattern established by 2' and 6'. The color dams 18' function to permit undesired movement of the different stencil mixes passing through the stencil openings during subsequent stenciling operations. Normally, these would be strips of metal brazed to a conventional stencil plate.

There is disclosed a technique for making a stencil plate from the conventional steel fabrication technique for forming a stencil plate. The steel fabrication technique is expensive from a manpower point of view since the apertures must be cut within the steel and then appropriately dressed by filing and grinding. Insert 6 must be formed and raised in place and also color dams must be formed and brazed in place. In a conventional plate of a size of 64 inches by 94 inches, this could involve the formation of as many as 180 apertures all equipped with appropriate insert 6' and color dams 18'. Substantial manpower is involved in the forming of this structure. The inventive technique substantially eliminates the hand manpower which is needed to fabricate the conventional stencil plate and the whole structure is formed by a series of electro-plating techniques which will yield a plate 2' having a thickness of 10-40 mils with a color dam having a height of about 30-80 mils.

What is claimed is:

1. The method of forming a flat stencil plate, the steps comprising:
    (a) placing a first resist coating on the surface of a matrix,
    (b) placing a film artwork over all the surface of the resist coating opposite from the side of the resist coating against the matrix,
    (c) exposing the film artwork and resist coating to sensitize the resist coating in select regions beneath the film artwork,
    (d) developing the exposed resist coating to provide a pattern of resist material with large open areas of no-resist material on the matrix and small islands of resist material on the matrix, some islands of resist material having open areas in the center thereof and channel means connecting these open areas in the islands with large open areas on the matrix,
    (e) then plating the surface of the matrix to deposit material in the large open areas, the open areas in the islands of resist material and in the channel means connecting said above two open areas to form on the matrix the deposited material in the form of large areas of deposited material with apertures therein where the resist material was present during plating and in some of the apertures there being small deposits of the plating material in the center region of the apertures with channels of depositing material connecting the small deposits of the plating material to the edges of the apertures, and (f) removing resist material and the matrix from the plated material to permit the deposited material to form a flat stencil plate with apertures therethrough and some apertures having deposited material within the center region of the apertures.

2. The method of forming a flat stencil plate, the steps comprising:

(a) placing a first resist coating on the surface of a matrix, (b) placing a film artwork over all the surface of the resist coating opposite from the side of the resist coating against the matrix, (c) exposing the film artwork and resist coating to sensitize the resist coating in select regions beneath the film artwork, (d) developing the exposed resist coating to provide a pattern of resist material with large open areas of no-resist material on the matrix and small islands of resist material on the matrix, some islands of resist material having open areas in the center thereof and channel means connecting these open areas in the islands with large open areas on the matrix, (e) then plating the surface of the matrix to deposit material in the large open areas, the open areas in the islands of resist material and in the channel means connecting said above two open areas to form on the matrix the deposited material in the form of large areas of deposited material with apertures therein where the resist material was present during plating and in some of the apertures there being small deposits of the plating material in the center region of the apertures with channels of depositing material connecting the small deposits of the plating material to the edges of the apertures, (f) placing a second resist coating on the surface of the deposited material to form a flat surface coating covering the deposited material and all the apertures therein, (g) placing a film artwork over all the surface of the second resist coating opposite from the side of the second resist coating against the deposited material, (h) exposing the film artwork and resist coating to sensitize the resist coating in selected regions beneath the film artwork, (i) developing the exposed resist coating to provide a pattern of resist material on the deposited material with large areas of the deposited material covered by the resist material and open channel areas in the resist material around the outside of the aperture perimeter of the apertures of the deposited material, (j) depositing the plating material in the open channel areas in the second layer of resist material to add additional deposited material to the first layer of deposited material in the form of raised walls of deposited material around the outside perimeter of the apertures of the first layer of deposited material, and (k) removing the resist material and matrix from the deposited material to permit the deposited material to form a flat stencil plate with apertures therethrough and some apertures having deposited material supported within the center region of the apertures and all the apertures having a raised walls of deposited material around the outside of the aperture on one side of the plate.

* * * * *